(12) United States Patent
Reis et al.

(10) Patent No.: US 8,484,602 B2
(45) Date of Patent: Jul. 9, 2013

(54) OPTIMIZING INTEGRATED CIRCUIT DESIGN BASED ON CELL LIBRARY

(75) Inventors: Andre Inacio Reis, Soborg (DK); Anders Bo Rasmussen, Copenhaven (DK); Vinicius Pazutti Correia, Soborg (DK); Ole Christian Andersen, Bagsvaerd (DK)

(73) Assignee: Nangate Inc., Santa Clara, CA (US)

( * ) Notice: Subject to any disclaimer, the term of this patent is extended or adjusted under 35 U.S.C. 154(b) by 0 days.

(21) Appl. No.: 13/204,322

(22) Filed: Aug. 5, 2011

(65) Prior Publication Data

US 2011/0296368 A1  Dec. 1, 2011

Related U.S. Application Data

(62) Division of application No. 12/366,450, filed on Feb. 5, 2009, now Pat. No. 8,024,695.

(60) Provisional application No. 61/026,222, filed on Feb. 5, 2008, provisional application No. 61/059,742, filed on Jun. 6, 2008, provisional application No. 61/059,744, filed on Jun. 6, 2008, provisional application No. 61/059,745, filed on Jun. 6, 2008, provisional application No. 61/059,746, filed on Jun. 6, 2008.

(51) Int. Cl.
*G06F 9/455* (2006.01)
*G06F 17/50* (2006.01)

(52) U.S. Cl.
USPC .............................. 716/132; 716/54; 716/104

(58) Field of Classification Search
USPC ........................................... 716/54, 104, 132
See application file for complete search history.

(56) References Cited

U.S. PATENT DOCUMENTS

| | | | |
|---|---|---|---|
| 5,666,288 A | 9/1997 | Jones et al. | |
| 5,956,257 A | 9/1999 | Ginetti et al. | |
| 6,539,533 B1 | 3/2003 | Brown, III et al. | |
| 6,539,536 B1* | 3/2003 | Singh et al. | 716/102 |
| 6,735,742 B2 | 5/2004 | Hatsch et al. | |
| 6,782,514 B2 | 8/2004 | Bhattacharya et al. | |
| 7,003,738 B2 | 2/2006 | Bhattacharya et al. | |
| 7,107,551 B1 | 9/2006 | de Dood et al. | |
| 7,225,423 B2 | 5/2007 | Bhattacharya et al. | |
| 7,260,807 B2 | 8/2007 | Shenoy et al. | |
| 7,634,743 B1* | 12/2009 | Ginetti | 716/103 |
| 2002/0049955 A1* | 4/2002 | Yamashita et al. | 716/1 |
| 2003/0084418 A1* | 5/2003 | Regan | 716/14 |
| 2005/0229142 A1 | 10/2005 | Boppana et al. | |
| 2007/0157141 A1 | 7/2007 | Salgunan | |
| 2007/0214439 A1 | 9/2007 | Reis et al. | |
| 2008/0244474 A1 | 10/2008 | Turner et al. | |

\* cited by examiner

*Primary Examiner* — Jack Chiang
*Assistant Examiner* — Brian Ngo
(74) *Attorney, Agent, or Firm* — Aka Chan LLP

(57) ABSTRACT

A method co-optimizes a design and a library in such a way to choose the best set of cells to implement the design. The method takes into account the idea of limiting the number of new cells while reducing target costs and respecting design constraints. The method chooses a minimum nearly optimum set of cells to optimize a design. This involves the simultaneous optimization of a cell-based design and a cell library used to implement it. The invention can produce only an optimized library for a specific application, when the circuit is disregarded. The method takes into account a set of new cells described as finalized cells or as virtual cells, possibly having different transistor topologies, different sizes, different logic functions, and/or different cell template than the original library.

17 Claims, 13 Drawing Sheets

OPTIMIZING INTEGRATED CIRCUIT DESIGN BASED ON CELL LIBRARY

CROSS-REFERENCE TO RELATED APPLICATIONS

This application is a divisional of U.S. patent application Ser. No. 12/366,450, filed Feb. 5, 2009, which is a nonprovisional of U.S. provisional patent applications 61/026,222, filed Feb. 5, 2008 and 61/059,742, 61/059,744, 61/059,745, 61/059,746, filed Jun. 6, 2008, which are incorporated by reference along with all other references cited in this application.

U.S. patent application Ser. No. 11/711,828, filed Feb. 28, 2007, which has published as U.S. patent application publication 2007/0214439 on Sep. 13, 2007, and U.S. provisional patent application 60/777,561, filed Mar. 1, 2006, are incorporated by reference.

BACKGROUND OF THE INVENTION

This invention relates to the field of electronic design automation, and more specifically, to optimization of digital circuits whose design is based on cell libraries.

Integrated circuits are important building blocks of the information age and are critical to the information age, affecting every industry including financial, banking, legal, military, high technology, transportation, telephony, oil, medical, drug, food, agriculture, education, and many others. Integrated circuits such as DSPs, amplifiers, DRAMs, SRAMs, EPROMs, EEPROMs, Flash memories, microprocessors, ASICs, and programmable logic are used in many applications such as computers, networking, telecommunications, and consumer electronics.

Consumers continue to demand greater performance in their electronic products. For example, higher speed computers will provide higher speed graphics for multimedia applications or development. Higher speed Internet web servers will lead to greater on-line commerce including on-line stock trading, book sales, auctions, and grocery shopping, just to name a few examples. Higher performance integrated circuits will improve the performance of the products in which they are incorporated.

Large modern day integrated circuits have millions of devices including gates and transistors and are very complex. As process technology improves, more and more devices may be fabricated on a single integrated circuit, so integrated circuits will continue to become even more complex with time. To meet the challenges of building more complex and higher performance integrated circuits, software tools are used. These tools are in an area commonly referred to as computer aided design (CAD), computer aided engineering (CAE), or electronic design automation (EDA). There is a constant need to improve these electronic automatic tools in order to address the desire for higher integration and better performance in integrated circuits.

Therefore, there is a need for improved techniques for electronic design automation.

BRIEF SUMMARY OF THE INVENTION

A method co-optimizes a design and a library (or a set of libraries) in such a way to choose the best set of cells to implement the design. The method takes into account the idea of limiting the number of new cells while reducing design costs and respecting design constraints. The method chooses a minimum nearly optimum set of cells to optimize a design. This involves the simultaneous optimization of a cell-based design and a cell library used to implement it. The method takes into account a set of new cells described as virtual cells, possibly having different transistor topologies, different sizes, different logic functionalities, and/or different cell template than the original library.

The mapping process can take as an input an extra method of describing possible cells not yet implemented, but with estimative costs available; these cells are referred as virtual cells in this application. The design is then mapped to real and virtual cells to determine an initial optimal set of cells. The remapped design is then incrementally remapped to reduce the number of cells used while not worsening significantly the implementation costs and still respecting the design constraints. The whole process may be iterated some number of times. After an ideal set of cells is determined, some extra sizes for each cell may be inserted to guarantee timing closure. The row height of the final set of cells can also be optimized to better fit the selected cells for the final library.

In an implementation, a method for simultaneous optimization of a circuit design and library includes: providing an initial circuit netlist, which can be expressed through a plurality of cells or Boolean equations, or other ways, such as RTL code; providing an initially existing set of cells (which can be empty); providing an additional set of admissible functionalities/cells, possibly including virtual cells; mapping the circuit to minimize implementation costs considering the initially existing set of cells and the additional set of admissible functionalities or cells; producing a new remapped netlist; and producing a new cell library specification and description composed of the preexisting cells and the admissible functionalities used in the remapped netlist.

The additional set of admissible functionalities or cells may be explicitly defined through a list of functionalities or cells, possibly including virtual cells. Each of the additionally admissible logic function may have different implementations, including: different transistor topologies, different sizing of the transistors and different drive strengths. The additional set of admissible functionalities or cells may be implicitly defined through some parameter. The additional set of admissible functionalities may be implicitly defined by the maximum number of inputs allowed. The additional set of admissible functionalities may be implicitly defined by the maximum number of series and parallel switches in a series or parallel association.

The additional set of admissible functionalities may be implicitly defined by the maximum number of arcs in series in a BDD implementation of the function. The additional set of admissible functionalities may be implicitly defined by the maximum allowed number of switches in series in a general transistor implementation. The additional set of admissible functionalities may be implicitly defined by the maximum allowed number of switches in the exact lower bounds for the number of switches in series in both transistor planes to implement a combinational logic function.

In an implementation, a method to optimize a cell library template includes: receiving target technology information; receiving a set of functionalities or cells to be included in the library; receiving a set of drive strengths to be created for each function; receiving or deriving a set of transistor topologies for each pair of function and drive strength; producing a preliminary estimate of cell characteristics for different alternative cell templates; and choosing a final template for the library as a function of the characteristics estimated for the ensemble of required cells.

In an implementation, a method to optimize a cell library associated to a circuit netlist after place and route includes:

receiving a place and routed circuit netlist; receiving the associated cell library; removing (or disregarding or disallowing the use of) unused cells from the library; optionally removing (or disregarding or disallowing the use of) unused drive strengths for used functionalities; for each of the used cells, adding a set of neighbor drive strengths, to allow further size adjustments; optionally adapting the cell library template to the new mix of cells according to any one or combination of constraints described in this patent; and outputting a new library specification considering the introduced modifications.

In an implementation, a method for optimization of a library for use in circuit design includes: providing an initial circuit netlist; providing one or more sets of existing cells; providing one or more sets of additionally admissible cells; analyzing the initial circuit netlist to find cells that reduce implementation costs considering the initially existing set of cells and the additional set of admissible cells; and outputting one or more new cell library specifications and descriptions including a subset of the preexisting cells and a subset of the admissible cells which potentially reduce design costs.

The initial circuit netlist can be provided by at least one of an expression of a number of cells or Boolean equations. Analyzing the initial circuit netlist can include remapping the circuit while considering the initially existing set of cells and the additional set of admissible cells. The method can include outputting a new remapped netlist.

The additional set of admissible cells can include at least an explicit set listing additionally available functionalities or cells. The additional set of admissible cells can include an explicit set listing additionally available cells, and each of the additionally admissible logic function can have different implementations. The additional set of admissible cells can include a set of functionalities or cells which is implicitly defined through some parameter.

The additional set of admissible cells can include a set of functionalities or cells which is implicitly defined by the maximum number of inputs allowed. The additional set of admissible cells can include a set of functionalities or cells which is implicitly defined by the maximum number of series and parallel switches in a series or parallel association. The additional set of admissible cells can include a set of cells which is implicitly defined by the maximum number of arcs in series in a BDD implementation of the function.

The additional set of admissible cells can include a set of functionalities or cells which is implicitly defined by the maximum allowed number of switches in series in a general transistor implementation. The additional set of admissible functions can be implicitly defined by the maximum allowed number of switches in the exact lower bounds for the number of switches in series in both transistor plans to implement a combinational logic function.

In an implementation, a method to optimize a cell library template includes: receiving target technology information; receiving a set of functions or cells to be included in the library; receiving a set of drive strengths to be created for each function; receiving or deriving a set of transistor topologies for each pair of function and drive strength; outputting a preliminary estimate of cell characteristics for different alternative cell templates; and choosing a final template for the library as a function of the characteristics estimated for the ensemble of required cells.

In an implementation, a method to optimize a cell library associated to a circuit netlist after place and route includes: receiving a place and routed circuit netlist; receiving the associated cell library; removing unused functions from the library; optionally removing unused drive strengths for used functions; for each of the used cells, adding a set of neighbor drive strengths, to allow further size adjustments; optionally adapting the cell library template to the new mix of cells; and outputting a new library specification considering the introduced modifications.

The optionally adapting the cell library template to the new mix of cells can include: receiving target technology information; receiving a set of functions or cells to be included in the library; receiving a set of drive strengths to be created for each function; receiving or deriving a set of transistor topologies for each pair of function and drive strength; outputting a preliminary estimate of cell characteristics for different alternative cell templates; and choosing a final template for the library as a function of the characteristics estimated for the ensemble of required cells.

In an implementation, a computer program product to optimize a library for use in circuit design is embodied using a computer-readable medium including: computer-readable code for providing an initial circuit netlist; computer-readable code for providing one or more sets of existing cells; computer-readable code for providing one or more sets of additionally admissible cells; computer-readable code for analyzing the initial circuit netlist to find cells that reduce implementation costs considering the initially existing set of cells and the additional set of admissible cells; and computer-readable code for outputting one or more new cell library specifications and descriptions including a subset of the preexisting cells and a subset of the admissible cells which potentially reduce design costs.

The computer program product can include computer-readable code for remapping the circuit while considering the initially existing set of cells and the additional set of admissible cells. The computer program product can include computer-readable code for outputting a new remapped netlist.

The additional set of admissible cells can include at least an explicit set listing additionally available functionalities or cells. The additional set of admissible cells can include an explicit set listing additionally available cells, and each of the additionally admissible logic function can have different implementations.

In an implementation, a method includes: providing a first integrated circuit design netlist; mapping groupings of components within the first integrated circuit netlist as corresponding to one or more cells in a first library of cells, stored on a computer-readable medium; removing from the mapping at least one grouping of components to a first cell, where the mapping will not include any first cell mappings; and generating a second library including only the cells identified in the mapping, where the second library does not include any first cell mappings and is stored on a computer-readable medium.

The method can further include: mapping the first integrated circuit design netlist to a second integrated circuit design netlist, which uses the second library but not the first library; and storing the second integrated circuit design netlist on a computer-readable medium. The method can include before generating the second library, adding in the second library a second cell, not in the first library, where the second integrated circuit design netlist includes at least on reference to the second cell.

The method can include: after generating the second library, identifying and removing at least a second cell of the second library; generating a third library including the cells of the second library, but not the second cell; mapping the first integrated circuit design netlist to a second integrated circuit design netlist, which has references to the third library but not first or second libraries; and storing the second integrated circuit design netlist on a computer-readable medium. Generating a second library may include performing a physical synthesis, not a logic synthesis, to obtain cells for the second library.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
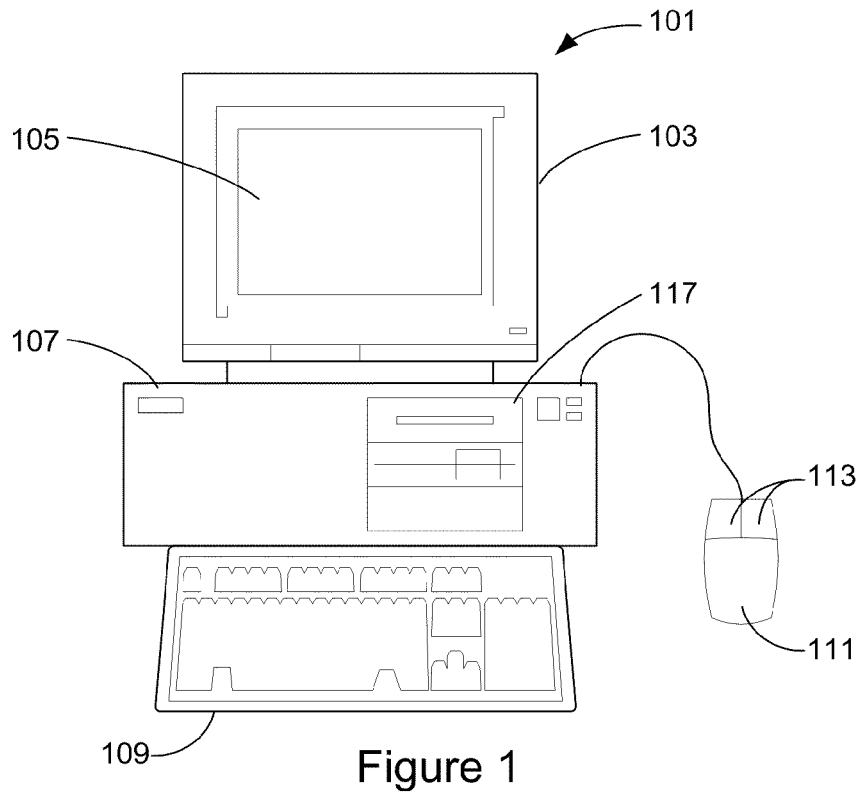
FIG. 1 shows a system of the present invention for performing electronic design automation.

FIG. 1 shows a system of the present invention. In an embodiment, the invention is software that executes on a computer workstation system, such as shown in FIG. 1. FIG. 1 shows a computer system 1 that includes a monitor 3, screen 5, cabinet 7, keyboard 9, and mouse 11. Mouse 11 may have one or more buttons such as mouse buttons 13. Cabinet 7 houses familiar computer components, some of which are not shown, such as a processor (including the possibility of a multiprocessor and gridding), memory, mass storage devices 17, and the like.

Mass storage devices 17 may include mass disk drives, floppy disks, magnetic disks, optical disks, magneto-optical disks, fixed disks, hard disks, CD-ROMs, recordable CDs, DVDs, recordable DVDs (e.g., DVD-R, DVD+R, DVD-RW, DVD+RW, HD-DVD, or Blu-ray Disc), flash and other nonvolatile solid-state storage (e.g., USB flash drive), battery-backed-up volatile memory, tape storage, reader, and other similar media, and combinations of these.

A computer-implemented or computer-executable version of the invention may be embodied using, stored on, or associated with computer-readable medium. A computer-readable medium may include any medium that participates in providing instructions to one or more processors for execution. Such a medium may take many forms including, but not limited to, nonvolatile, volatile, and transmission media. Nonvolatile media includes, for example, flash memory, or optical or magnetic disks. Volatile media includes static or dynamic memory, such as cache memory or RAM. Transmission media includes coaxial cables, copper wire, fiber optic lines, and wires arranged in a bus. Transmission media can also take the form of electromagnetic, radio frequency, acoustic, or light waves, such as those generated during radio wave and infrared data communications.

For example, a binary, machine-executable version, of the software of the present invention may be stored or reside in RAM or cache memory, or on mass storage device 17. The source code of the software of the present invention may also be stored or reside on mass storage device 17 (e.g., hard disk, magnetic disk, tape, or CD-ROM). As a further example, code of the invention may be transmitted via wires, radio waves, or through a network such as the Internet.

Figure 2:
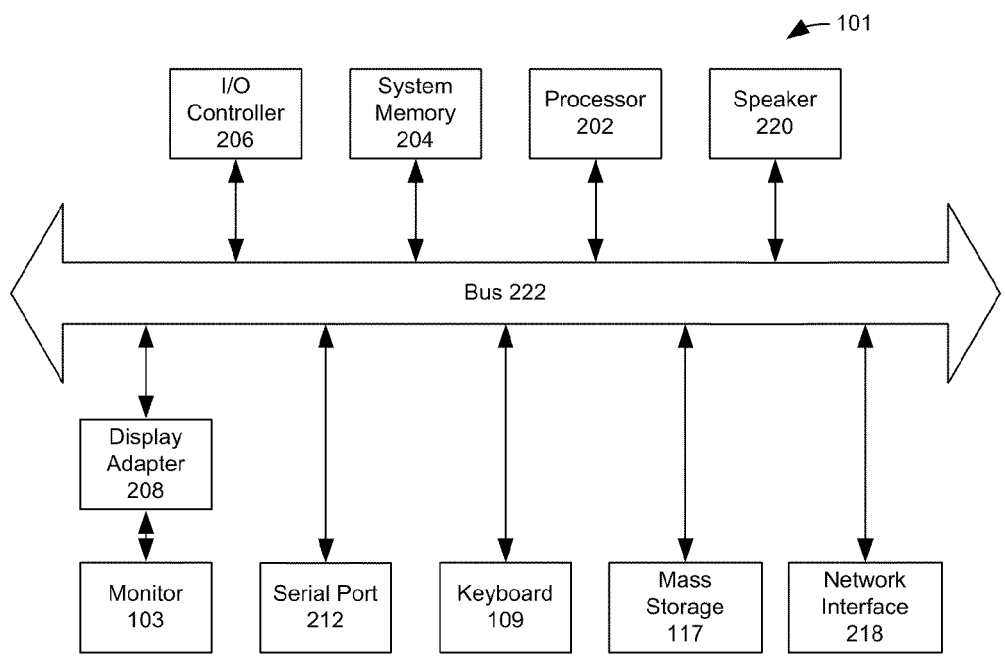
FIG. 2 shows a simplified system block diagram of a computer system used to execute software of the invention.

FIG. 2 shows a system block diagram of computer system 1 used to execute software of the present invention. As in FIG. 1, computer system 1 includes monitor 3, keyboard 9, and mass storage devices 17. Computer system 1 further includes subsystems such as central processor 202, system memory 204, input/output (I/O) controller 206, display adapter 208, serial or universal serial bus (USB) port 212, network interface 218, and speaker 220. The invention may also be used with computer systems with additional or fewer subsystems. For example, a computer system could include more than one processor 202 (i.e., a multiprocessor system) or the system may include a cache memory.

The processor may be a dual core or multicore processor, where there are multiple processor cores on a single integrated circuit. The system may also be part of a distributed computing environment. In a distributed computing environment, individual computing systems are connected to a network and are available to lend computing resources to another system in the network as needed. The network may be an internal Ethernet network, Internet, or other network.

Arrows such as 222 represent the system bus architecture of computer system 1. However, these arrows are illustrative of any interconnection scheme serving to link the subsystems. For example, speaker 220 could be connected to the other subsystems through a port or have an internal connection to central processor 202. Computer system 1 shown in FIG. 1 is but an example of a computer system suitable for use with the present invention. Other configurations of subsystems suitable for use with the present invention will be readily apparent to one of ordinary skill in the art.

Computer software products may be written in any of various suitable programming languages, such as C, C++, C#, Pascal, Fortran, Perl, Matlab (from MathWorks, Inc.), SAS, SPSS, Java, JavaScript, TCL, and AJAX. The computer software product may be an independent application with data input and data display modules. Alternatively, the computer software products may be classes that may be instantiated as distributed objects. The computer software products may also be component software such as Java Beans (from Sun Microsystems) or Enterprise Java Beans (EJB from Sun Microsystems).

An operating system for the system may be one of the Microsoft Windows® family of operating systems (e.g., Windows 95, 98, Me, Windows NT, Windows 2000, Windows XP, Windows XP x64 Edition, Windows Vista, Windows 7, Windows CE, Windows Mobile), Linux, HP-UX, UNIX, Sun OS, Solaris, Mac OS X, Alpha OS, AIX, IRIX32, or IRIX64, or combinations of these. Microsoft Windows is a trademark of Microsoft Corporation. Other operating systems may be used. A computer in a distributed computing environment may use a different operating system from other computers.

Furthermore, the computer may be connected to a network and may interface to other computers using this network. For example, each computer in the network may perform part of the task of the many series of steps of the invention in parallel. Furthermore, the network may be an intranet, internet, or the Internet, among others. The network may be a wired network (e.g., using copper), telephone network, packet network, an optical network (e.g., using optical fiber), or a wireless network, or any combination of these. For example, data and other information may be passed between the computer and components (or steps) of a system of the invention using a wireless network using a protocol such as Wi-Fi (IEEE standards 802.11, 802.11a, 802.11b, 802.11e, 802.11g, 802.11i, and 802.11n, just to name a few examples). For example, signals from a computer may be transferred, at least in part, wirelessly to components or other computers.

This invention is related to the optimization of digital circuits whose design is based on cell libraries. Most digital designs are currently based on cell libraries. This means that most design flows will have a step where the Boolean logic equations are mapped to an interconnected set of cells from the library (or set of libraries). The cells from the library implement logic primitives (Boolean functions and storage elements) that are then connected to each other to produce the desired functionality for the complete circuit. The step of converting the equations to a set of interconnected cells is done in a way to obey constraints in some costs (typically required operating frequency) while minimizing other costs (typically area and power). This step is normally known as technology mapping, and there are several tools available from different vendors or universities to perform technology mapping. The inputs to this tool typically are a design, a predesigned library and the optimization goals.

Cell-based design can involve the concepts of mapped and unmapped designs, optimization goals, design constraints, target library, library template. This invention makes use of the concepts of enriched library, used subset, histogram of use, contribution of instances, virtual cells, nearly compacted cells, cell generator tool and cell generator API. These concepts are briefly discussed below.

Mapped and unmapped design. A design (or part of a design) is said to be mapped when it is expressed as a network of interconnected cells from a library. Each cell in the library may be instantiated many times; some may be less instantiated (even just once) and some cells available in the library may not be used at all. A design (or part of a design) is said to be unmapped when it is described at a higher level, without making references (instantiations) to cells from a library as subdesigns. The task of minimizing design costs while converting an unmapped design into a mapped design is normally called technology mapping. Similarly, the term remapping is used for the conversion of a mapped design into a different mapped design; the term technology independent optimization is used for the conversion of an unmapped design into a different unmapped design; and the term unmapping is used for the conversion of a mapped design into an unmapped design.

Optimization goals and design constraints. Optimization goals and design constraints describe to the optimization tool what are the requirements of the designer for the particular design being treated. Typically the optimization tool receives a mix of optimization goals and design constraints, which can be expressed for various points of the circuit. Examples include: minimize area and power while respecting desired arrival times and frequencies; reduce timing and respect maximum area; respect maximum area and increase yield. Many combinations of design goals and constraints can be used by designers to achieve their goals.

Target library. For any optimization step that produces a mapped design, which will refer to a library, it is necessary to specify the target library, containing the cells that can be used by the mapping tool. It is possible for mapping tools to deal with more than one target library, as the available cells can be divided into different libraries. The target libraries can include some or all of the initial libraries used for the initial circuit.

Library template. As the final layout of the complete design is done by placing cells side by side, the design of the cells is restricted so that they will fit together more easily when placed this way. Vendors can provide libraries with different templates to accommodate different design goals, like power consumption or high speed. It is not uncommon for a vendor to provide at least three different standard cell libraries for the same technology node: general purpose, high speed and low power versions of the libraries. Some vendors may provide additional other versions.

These libraries may use different templates and have different row heights and power grid sizes. Alternatively, these libraries may use the same template or compatible templates to be used in the same design. Designers may have to choose among the different versions of the library (e.g., general purpose, high speed, and low power) to implement their designs when the different versions of the library have incompatible templates and the design tools do not support the use of the different templates. Designers can mix cells from the different versions of the libraries when the libraries have same or compatible templates. Some templates can accommodate double height cells, which will occupy two adjacent rows.

A problem the invention solves is to choose a minimum nearly optimum set of cells to optimize a design, considering the possibility of enriching the available target library by adding new cells. This involves the simultaneous optimization of a cell-based design and a cell library used to implement it. Note that the user may be interested only in the optimized library, so the circuit may be used only to guide the library optimization process. In this case, the invention produces a library that is optimized for a specific design, without the need to output the optimized circuit. The method takes into account the fact that the library can be enriched by adding new cells, possibly having different transistor topologies, different sizes, different logic functionalities, and/or different cell template than the original library.

Enriched library. A library is said to be enriched if the designer add new cells to it in order to optimize the design.

Used subset. After mapping a design, the mapped design makes reference to specific cells from the library, which are instantiated in the design. Not necessarily all the cells from the library are instantiated in the design. The set of all the cells that are instantiated at least once in a given mapped design compose the used subset of the library with respect to that given design.

Histogram of use. Given a mapped design and a used subset of a library with respect to that particular design, each cell in the used subset will have a particular number of instances in the design. Some cells may be used only once, while others can be instantiated many times. The histogram can be weighted according to some characteristic from the library or from each individual cell (like area, power, delay, and so forth).

Contribution of instances. The contribution of each instance to the design can be measured by how many times it is used in the design (data available from the histogram of use)

and by how many times the cell appears in low slack instances (which are related to the contribution to the cell for timing closure of the circuit). The contribution of the instances may be computed with respect to a limited region of the design or with respect to a subdesign.

Virtual cells. Virtual cells are cells that have data generated not from a final layout description of the cells. These virtual cells have not yet been implemented or characterized in their final form (to be used in tape out) but they have estimated costs available, allowing their use during the design and optimization process. The estimated costs are ether derived from other sources than the final layout or are derived from the final layout with a degree of precision different than the ones used for tape out. Depending on how far the virtual cells or they estimated costs are from the final physical implementation (used for tape out), the virtual cells may be virtual to a greater or smaller degree. The nearer the virtual cells are to their final tape out version, the lesser they are virtual. The farther the virtual cells are from their final tape out version, the more they are virtual.

Normally the placement and routing of transistors before compaction (this description is sometimes called stick diagram) is used to estimate area and electric characteristics. If the estimation is done purely from a spice netlist, we call the cells virtual-virtual cells or virtual2 cells. The method of producing virtual cells used in this invention is different from previous approaches, which interpolate existing cells to obtain in-between drive strengths. In the present approach, the costs for cells are derived through an estimation API provided by the cell generator. These costs may be already pre-computed and be available in the set of additional cells. Note that each cell has a functionality, expressing the behavior of the cell, that can be a combinational function (AND2, OR3, NAND4, AOI22, and others) or a memory element (FFD, FFDSR, and so forth). More than one cell can have the same functionality, varying the drive strength, transistor topology, logic family, cell template, and so forth.

Nearly compacted cells. Nearly compacted cells are cells that still contain some design rule check (DRC) errors, but for which the area and electric characteristics can be derived with a very good precision. Virtual cells can also be derived from fully compacted cells by performing a light characterization that results in characterization data that is less precise, but that is less time consuming to obtain.

Cell generator tool. A cell generation tool is a tool that can generate cells to be used in a cell-based design. The user has to specify the desired functionality for the cells to be generated. The cell generator tool can generate cells starting from a logic equation or from a spice netlist or other forms to specify the desired cells. The cell generation is based on a technology definition (providing information about target technology design rules) and a desired cell template for the cells. One example of cell generator is the Nangate Library Creator™ tool whose user's manual is incorporated by reference along with other Nangate software user manuals, Nangate software screens including help screens, and all other references cited in this application. Cell generation tools may depend on external tools for the characterization or have a closely integrated tool to perform the characterization. One example of a library characterization tool is the Nangate Library Characterizer™ tool.

Trademarks are property of their respective owners. Nangate Library Creator and Nangate Library Characterizer are trademarks of Nangate A/S.

Cell generator API. A cell generator API can provide an interface to estimate cell costs (area, delay, power, and so forth) by using different degrees of precision. Depending on how far from the final physical implementation (used for tape out) the virtual cells are, they may present different degrees of virtuality. The lesser the degree of virtuality, the near the virtual cells are to their final tape-out version. From the previous discussion, a cell can have its cost generated with at least four different options of precision: virtual2, virtual, nearly compacted, and final layout. The cell generator application program interface (API) can provide all these four different methods to generate cell and library data. The cell generator API can be used to retrieve real or estimated costs for admissible functionalities and would return an infinite cost for functionalities considered not available.

This invention is devoted to use an enriched library to optimize a design. The space of solutions is enlarged by the library enrichment, and in subsequent steps the enriched library is filtered to limit the number of added cells to a number defined by the user. The goal is to obtain a maximum gain from the enrichment of the library, without adding more cells than allowed by the designer. From a utility point of view, this process allows to co-optimize a design together with the library used to implement it.

Figure 3:
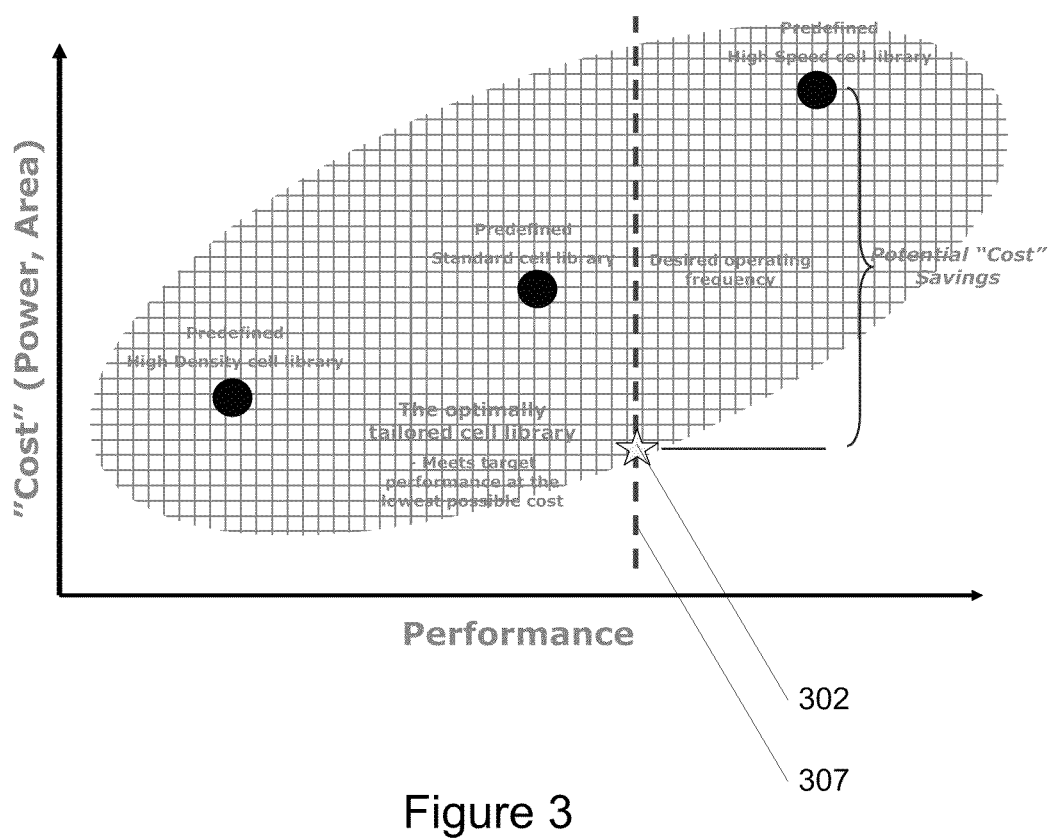
FIG. 3 shows a graph of performance versus cost trade-off when considering the library as part of the design space.

FIG. 3 shows a graph of performance versus cost trade-off when considering the library as part of the design space. FIG. 3 illustrates the problem definition: to find a library (represented as a star point 302) that achieves the desired performance (dotted line 307), while minimizing the implementation costs to introduce potential cost savings. Note that the costs presented in the figure are area, delay, and power. These were cited as examples, not as a restriction on the invention; any figure of merit (area, power, delay, yield, and others) that can be measured could be optimized during this process.

Advantages of the proposed method include the exploitation of library as part of the design space.

Previously, some approaches work with a completely virtual library, without consideration of detailed physical aspects and without trying to filter it. These approaches use purely virtual libraries, where the library is defined by some topological parameter. The only goal is to minimize the number of transistors. Actual area and characterization is inexistent and not taken into account. No active filtering is performed in the number of cells, so the resulting number of cells in the library may increase significantly.

These approaches are very imprecise, as it takes no actual data into account—no characterization, no area, no detailed data about the cells or their configuration; only number of transistors is considered. Another disadvantage is that there is no active limitation in the number of used cells.

Some approaches filter an existing library without enriching or extending it. For instance, one approach only filters cells from a previously existing library. No enrichment is done. These approaches have the main limitation that it just filters an existing precharacterized library; the approach does not see extra cells that could improve the design. Another limitation is that the filtering of cells is done cell by cell, and neighbor size cells are not preserved for timing closure.

Some approaches enrich a library, but the enrichment will be limited to add new drive strengths, not new functionalities. This way, the enrichment will consider only new sizes for existing cells. No new functionality is added. The enrichment is limited to functionalities existing (and already characterized) on an initial library. This happens because the characteristics of the virtual cells used to create new sizes are derived from the existing cells in the library.

These approaches do not add new functionalities to the library and cannot exploit new topologies as all the data is generated from existing cells. Only cells that already exist in the library can be used, as properties are derived from existing cells in the library. This makes the use of new topologies (e.g., transistor netlists) very imprecise for functionalities that already exist in the library with a given topology. In order to assure precision, this approach implicitly assumes that the topologies of the cells in the library are known, so that new cells with similar topology (and therefore with similar properties, which could be derived correctly from existing cells) can be created.

Another approach uses on-the-fly creation of new cells for optimizing a specific design. This approach does not take an initial (virtual) library into account. It searches the design and creates new cells for candidate points for optimization. The creation of new cells is done based on context specific information, which is used to produce new cells that will be used to replace part of the existing circuit.

A method creates a design specific cell. A method substitute parts of a circuit (e.g., a subcircuit) by a specific cell. A method reduces the number of new cells created in the process of adding design specific cells. A method performs prelayout estimation of cell characteristics in this context. It can be viewed as one possible method to generate the virtual cells. A method generates logic circuits having a functionally redundant transistor network. A method receives a design mapped to a given cell library, then the transistor sizes of the cells are changed, in order to speed up the circuit. This change of transistor sizes results in adding new cells to the library, which is then redesigned to accommodate the new cells.

These approaches work with the creation of design specific cells to be used as a substitute for subcircuits. It can take a long time (as the characterization and performance evaluation is done on the fly) and it does a more local search as a consequence. Another disadvantage is that it is devoted to in-place optimizations, and any modifications in the placement of the cells could modify the environment and the boundary conditions for which the cell was created. If this happens, the design specific cell would be no longer valid. As neighbor sized cells are not provided in this prior art, the timing closure would be negatively impacted in this particular case. In this sense, this prior art provides a much more limited enrichment of a design specific library with new cells.

A method for library generation has the cell descriptions a priori. So it is a method to develop a generic library once the cells are known. There is not any design specificity taken into account in this method, so it is possible to say that it is not a design specific library creation method. These approaches do not optimize a library for a specific design. It simply produces cell layouts to form a library once the cells are specified. It is the responsibility of the designers to choose the cells themselves and the method does not help the designers at all in this task.

Figure 4:
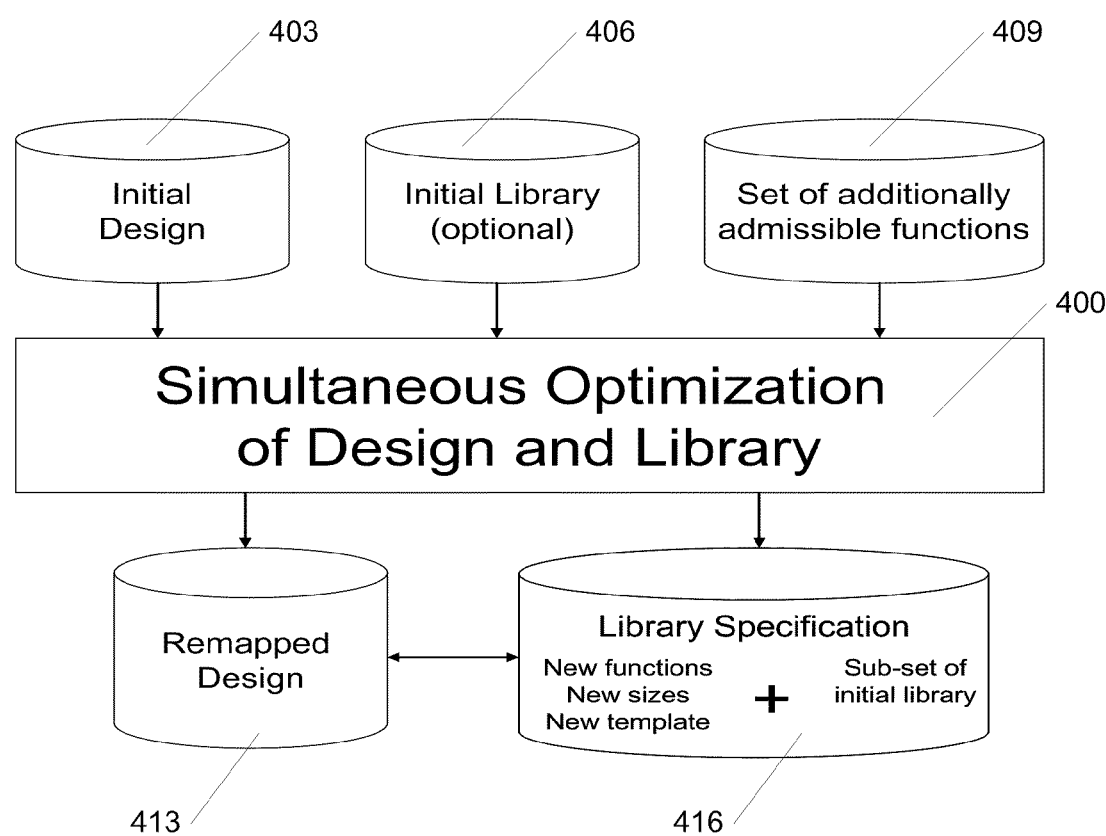
FIG. 4 shows a system flow of input and output data for simultaneous optimization of digital design and library.

This patent provides a novel methodology to perform simultaneous optimization of a digital design together with the cell library used on its implementation. FIG. 4 shows a system flow to perform this co-optimization.

FIG. 4 shows a system flow of input and output data for simultaneous optimization of digital design and library 400. Typically, the method takes as inputs an initial design 403, initial library 406 (option), and set of additionally admissible functionalities 409. The output from process 400 is a remapped design 413 and library specification 416.

The library specification or optimized library has new functions, new sizes, new template, and may also include a subset of the initial library. Note that the user may be interested only in optimized library 416, so circuit 403 may be used only to guide library optimization process 400. In this case, the technique produces library specification 416 that is optimized for a specific design, without the need to output the optimized circuit 413. The remapped design or circuit may not be output in this case.

Three input items are circuit or initial design 403 to be optimized, initially existing cell library 406 (which can be empty), and set of additionally admissible logic functionalities 409 implicitly or explicitly defined. Other input items such as design constraints and optimization goals, can be used by the method, even if not explicitly shown in the drawing. Design constraints are familiar for a person skilled in the art of circuit design, so they will not be discussed in this description.

The circuit to be optimized can be described either as a netlist of gates or as a set of equations or a mix of the two, or other formats. The initial circuit, or circuit to be optimized, may also have been obtained from RTL and may already have been optimized from some degree. A netlist of gates is a description of a circuit making instantiations and interconnecting gates that are described in the initially existing library. The functionality of the circuit can be derived from the description of the gates and their interconnection. Alternatively, the circuit to be optimized can be described as a set of Boolean equations expressing the functionality of the circuit directly, without making instances to specific gates in a library. The initial circuit can also make reference to a generic library, where only the functionality of the gates is described.

Note that any circuit description for which the functionality to be treated can be described can be used in the scope of this invention, including mixed descriptions containing cell references from a library and unmapped parts of the circuit described through equations, truth tables, binary decision diagrams (BDDs), or any equivalent form.

The initially existing library contains a set of cells that already are available for the design. Notice that this set can be empty; and if this set is not empty, a subset of the library may be disallowed or disregarded or marked as "don't use." The cells may or may not be referenced in the initial description of the circuit to be optimized, which can be a mapped, unmapped or partially mapped or unmapped circuit, or combinations of these.

The set of additionally admissible cells (logic functionalities) defines the list of additional (with respect to the original library) cell functionalities that can be viewed as single cells. In this sense, the target library can be seen as the set union of the cells in the original library (or libraries) with the set of additionally admissible logic functionalities. In this flow, the new admissible functionalities are used to generate candidate cells to be added to the library, thus enriching the set of available cells. The set of additionally admissible functionalities can be described implicitly or explicitly or even by a combination of the two (implicit and explicit definition).

Some different examples of implicit definition of a library are given below. The examples in this application (below and elsewhere) are provided to illustrate some aspects the invention and these aspects can be applied and modified as needed or desired for a particular application. The breadth of the invention should not be limited or restricted in any way to the specific examples given.

Example 1 (for implicit library definition): by number of inputs. When defining a library by number of inputs, functionalities can be accepted or discarded according their number of inputs. The specific values for the numbers of inputs to be accepted or rejected are parameters that implicitly define the functionalities in the library.

Example 2 (for implicit library definition): by number of series and parallel transistors in a series parallel implementation. When defining a library by number of series and parallel transistors, functionalities can be accepted or discarded according their number of series and parallel transistors. The specific values for the numbers of series and parallel transistors to be accepted or rejected are parameters that implicitly define the functionalities in the library.

Example 3 (for implicit library definition): by BDD height. When defining a library by BDD height, functionalities can be accepted or discarded according the height of a BDD representing the functionality. The specific values for the BDD heights to be accepted or rejected are parameters that implicitly define the functionalities in the library.

Example 4 (for implicit library definition): by the minimum (worst case) length transistor chains achievable in a general switch implementation. This is a "lower bound" in the number of series transistors. When defining a library by the minimum achievable (worst case) length of transistor chains, functionalities can be accepted or discarded according their minimum achievable (worst case) length of transistor chains. The specific values for the minimum achievable (worst case) length of transistor chains to be accepted or rejected are parameters that implicitly define the functionalities in the library.

Example 5 (for implicit library definition): any combination of the four methods above, including combining functionalities from these examples with functionalities present in the original library (including generating associations of cells in the original library). Note that for each cell functionality defined implicitly or explicitly, cells variations can be created, including different transistor topologies, different sizing of the transistors, and different drive strengths. Note that these methods are presented for exemplification only and the invention is not restricted to use the methods exemplified here.

The explicit definition consists in explicitly listing the set of additionally admissible logic functionalities. This consists in explicitly providing a list of additionally available functionalities in any format suitable for the execution of the method.

Notice that any form of defining additionally available functionalities is valid in the context of the invention. The listed methods have an illustrative character, not a restrictive one.

The outputs of the method include a mapped netlist and a set of cells composing a new library. Note that the user may be interested only in the optimized library, so the circuit may be used only to guide the library optimization process. In this case, the invention produces a library that is optimized for a specific design, without the need to output the optimized circuit. The mapped netlist and a set of cells composing a new library are described in the following.

The mapped network is a set of interconnected cells that implement the original circuit, possibly with some advantages in terms of cost, including but not limited to area, delay and power consumption. The specific advantages to be obtained are guided by the designer through the description of design constraints and goals for the mapping tool. The cells used in the mapped network are listed in the new library that is also output by the method.

The new library output by the method can contain any of the following.

1. The existing library itself, meaning a combination of the existing cells.
2. An enriched library, meaning that new cells (from the set of additionally available cells) have been added to the existing library. New cells can represent new logic functionalities or new drive strengths for existing logic functionalities, including new transistor topologies for existing functionalities. The goal of introducing new cells is to reduce area, delay and power of the final design. The specific advantages to be obtained are guided by the designer through the description of design constraints and goals for the mapping tool. Note that during this process, some cells from the original library may be removed, disregarded, disallowed, or marked as don't use due to the introduction of more efficient cells in the enriched library.
3. A new library, meaning that the cell template has changed, to better fit the cell mix in the new cell library. Again, new logic functionalities and new drive strengths for existing cells can be added to the existing library. However, if a new template is chosen, the original cells can possibly be redesigned to fit in the new template. The new template may be introduced as the old one is not the best one considering the new mix of cells.
4. A new mixed-template library, consisting of cells available in more than one template. The principle is similar to the "new library" described above, but cells may be made available in different templates if the place and route tool is able to cope with nonuniform cell templates, or with circuit regions using different templates or power regions or different Vt versions of the cells. The mixed-template library may use incompatible templates and have different row heights and power grid sizes; or it may use compatible templates to be used in the same design. This way, designers can choose among different template versions of the cells to be used for different circuit template regions for the case of incompatible templates, or the designers can mix cells in any region of the circuit if the templates are compatible. Some templates can accommodate double-height cells, which will occupy two adjacent rows.

Figure 5:
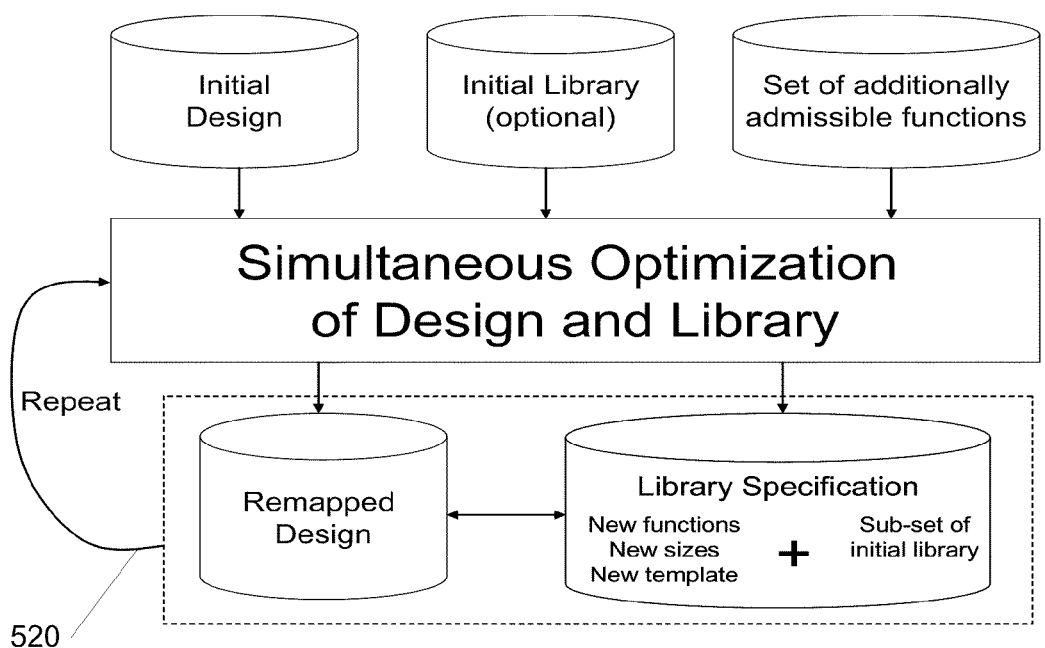
FIG. 5 shows a system of input and output data for simultaneous optimization of digital design and library, showing the possibility of iteration of the process.

Note that the new design and library specification produced by the method can be used, as shown in FIG. 5, as input 520 to the optimization process, producing iterative optimization. The optimization process can be iterated any number of times (e.g., 2, 3, 4, 5, 6, or 7 or more times). This is important as it is well known that the results produced by optimization tools are dependent on the initial data, so iterations can provide further improvement. In a more general view of iterative process, the optimization can reuse any previous version of the design or the library produced in previous iterations.

With respect to FIG. 5, note that the user may be interested only in the optimized library, so the circuit may be used only to guide the library optimization process. In this case, the invention produces a library that is optimized for a specific design, without the need to output the optimized circuit. The circuit may not be output in this case.

Figure 6:
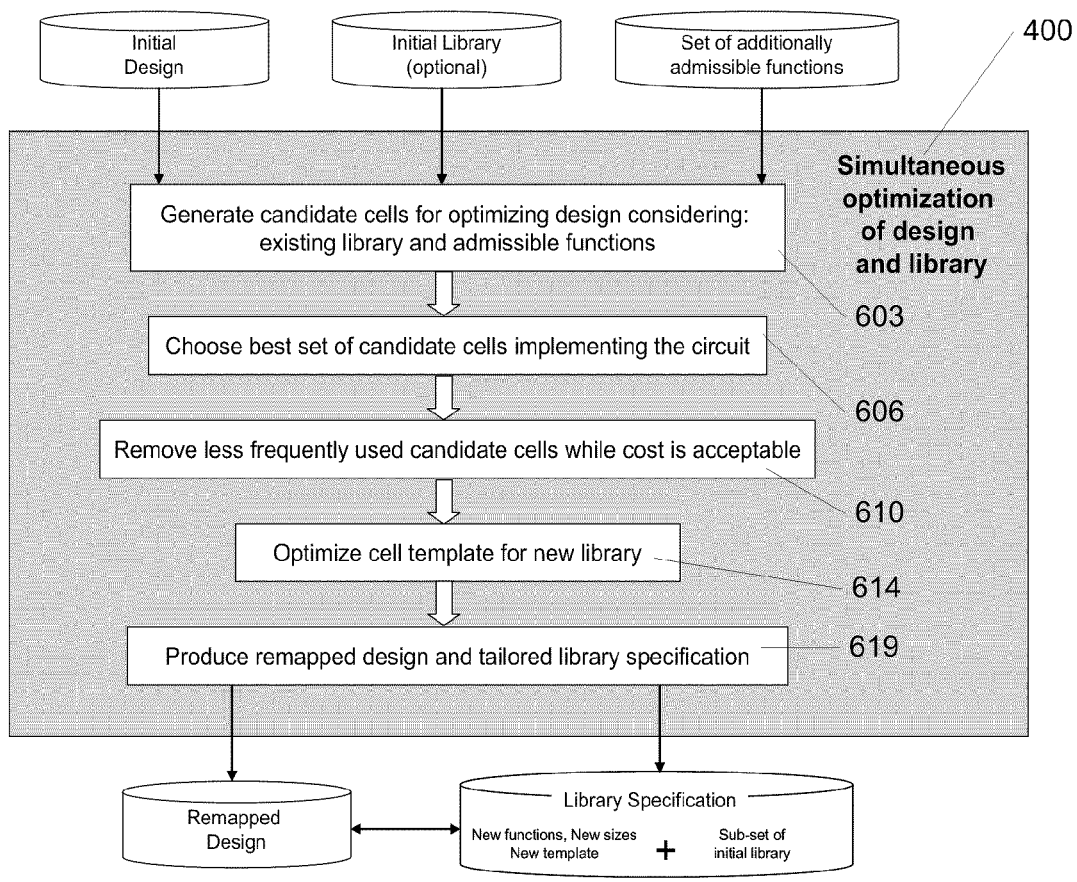
FIG. 6 shows a flow for one possible implementation for simultaneous optimization of digital design and library.

One possible flow 400 that can be applied to implement the proposed method for simultaneous optimization of design and library is shown in FIG. 6. The steps of a specific implementation of a flow are described in the following.

With respect to FIG. 6, note that the user may be interested only in the optimized library, so the circuit may be used only to guide the library optimization process. In this case, the invention produces a library that is optimized for a specific design, without the need to output the optimized circuit. The circuit may not be output in this case.

A specific flow is presented below, but it should be understood that the invention is not limited to the specific flows and steps presented. A flow of the invention may have additional steps (not necessarily described in this application), different steps which replace some of the steps presented, fewer steps or a subset of the steps presented, or steps in a different order than presented, or any combination of these. Further, the steps in other implementations of the invention may not be exactly the same as the steps presented and may be modified or altered as appropriate for a particular application or based on the data.

1. In a step 603, generate matches that identify candidate cells for optimizing the design considering existing library and admissible functionalities. Basically this step identifies portions of the circuit corresponding to cells in the initial library or functionalities in the set of admissible functionalities (which can become cells). This phase is commonly called matching, by people knowledgeable in the art. However, here it presents an original characteristic of being able to identify physical, virtual and virtual2 cells at the same time.

2. In a step 606, choose best set of candidate cells implementing the circuit. Once the different portions of the circuit have candidate cells assigned, the technique chooses a subset of the candidates such they implement the circuit with the desired trade-off for area, delay, and power consumption costs. The choice performed in this phase is commonly called covering, by people knowledgeable in the art.

3. In a step 610, remove less frequently used candidate cells while cost is acceptable. This step will look into the result of the covering phase and remove the instances of cells that have only a small number of instances. These portions of the circuit are then remapped considering the set of remaining used cells. The goal on this step is to reduce the overall number of cell candidates (and the size of the library), while not increasing significantly the design implementation costs and respecting the design constraints. Note that this process can remove, disregard, or mark as don't use, cells from any library in use for the design.

4. In a step 614, optimize cell template for new library. As a new mix of cells is produced, the library template can be optimized to better accommodate the set of cells present in the optimized library. The library template defines cell height, width of power supplies, regions for P-type and N-type diffusion, and so forth.

5. In a step 619, produce remapped design and tailored library specification. The tailored library specification includes a variety of drive strengths for the cells that are used in the remapped design. The call for this variety of drive strengths come from the fact that the drive strengths that will be needed for closing time after place and route are not known a priori.

Note that as the output library contains virtual and virtual2 cells, the output library in FIG. 6 is a library specification. This means the virtual and virtual2 cells used in the remapped design have to be used as a specification to produce physical cells, before the final tape out of the circuit. Note that the user may be interested only in the optimized library, so the circuit may be used only to guide the library optimization process. In this case, the invention produces a library that is optimized for a specific design, without the need to output the optimized circuit.

Figure 7:
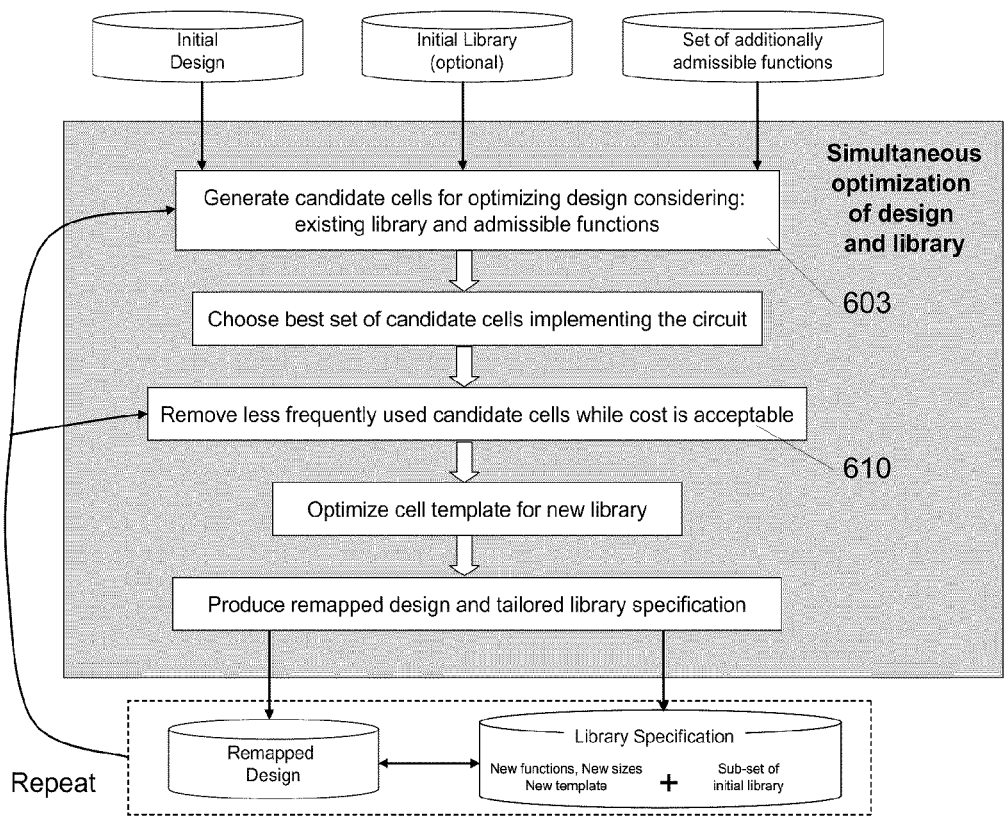
FIG. 7 shows a flow for one possible implementation for simultaneous optimization of digital design and library, showing the possibility of iteration of the process.

Again the reader should note that the new design and library specification produced by the method can be used as input to the optimization process, producing iterative optimization, as shown in FIG. 7. The new design and library specification can be used as input to steps 603 or 610. This is important as it is well known that the results produced by optimization tools are dependent on the initial data, so iterations can provide further improvement. In a more general view of iterative process, the optimization can reuse any previous version of the design or the library produced in previous iterations.

With respect to FIG. 7, note that the user may be interested only in the optimized library, so the circuit may be used only to guide the library optimization process. In this case, the invention produces a library that is optimized for a specific design, without the need to output the optimized circuit. The circuit may not be output in this case.

Figure 8:
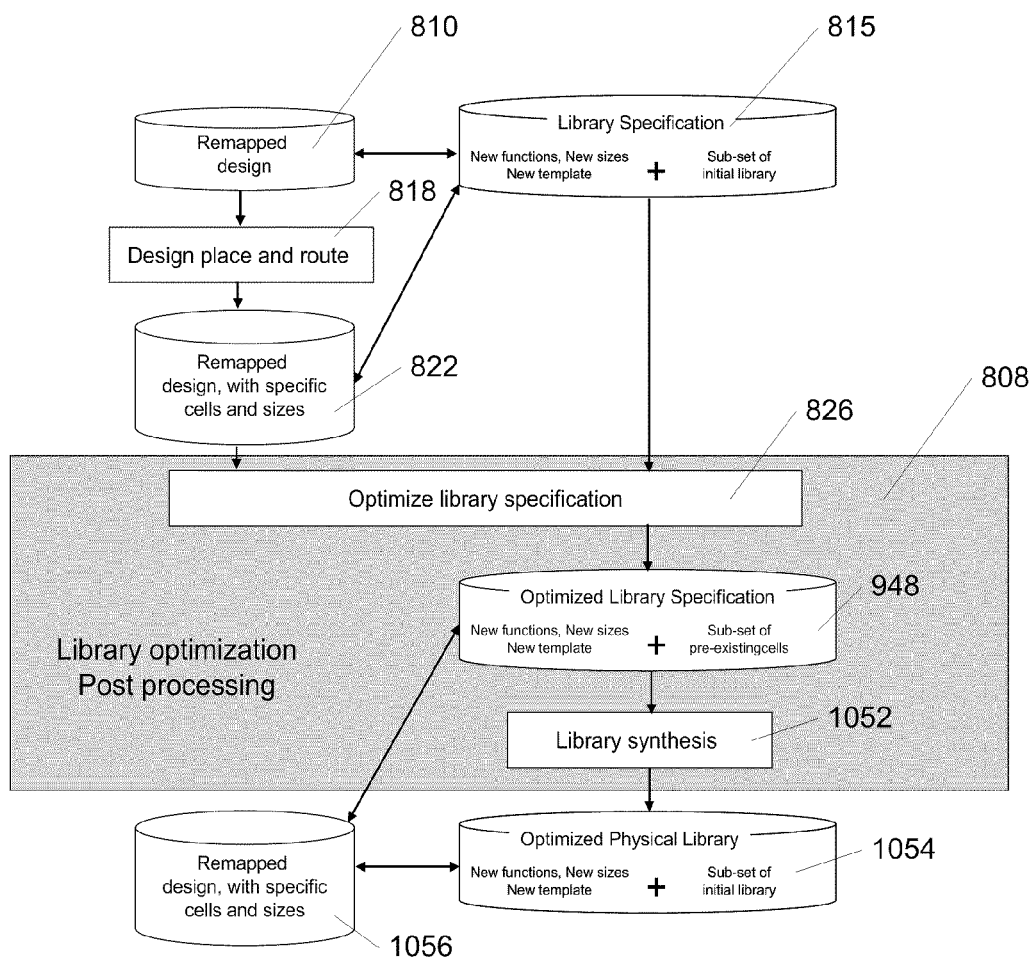
FIG. 8 shows a process of performing mapping and placement and routing as a means to select the effective drive strengths that need to be synthesized for a specific design.

The methods described here can be further enhanced through a postprocessing step 808, as described in FIG. 8. With respect to FIG. 8, note that the user may be interested only in the optimized library, so the circuit may be used only to guide the library optimization process. In this case, the invention produces a library that is optimized for a specific design, without the need to output the optimized circuit. The circuit may not be output in this case.

This postprocessing step consists of using an output mapped netlist 810 and output enriched library 815 produced by the method to derive a new version of the design by performing placement and routing 818. This placed and routed version 822 of the design allows verifying which cells and sizes from the initial cell library are effectively used in a physical implementation of the circuit. This way, it is possible to carry out a further optimization 826 of the library specification taking into account the effectively used cells and sizes.

Figure 9:
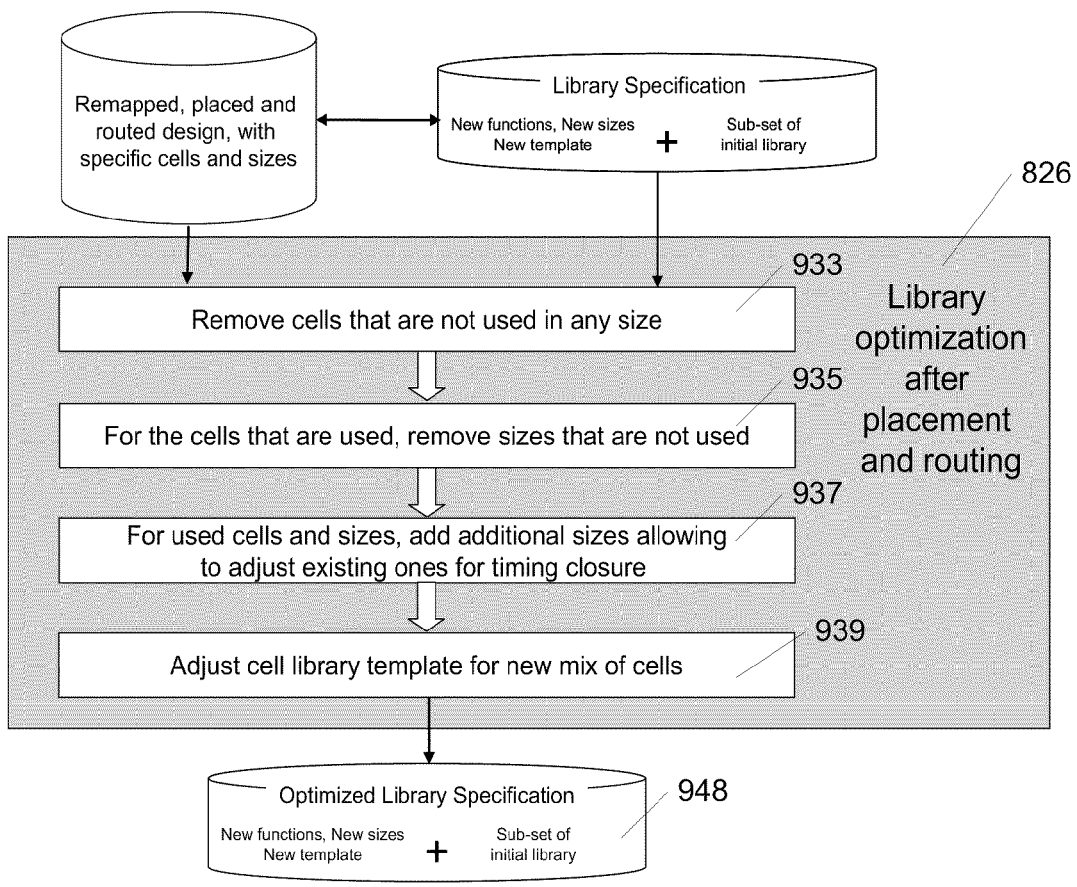
FIG. 9 shows a process of optimizing library specification after placement and routing.

The process (826) of optimizing the library specification after placement and routing is described in more detail in FIG. 9. This process can adopt some level of placement protection, where the existing cells remain at the same place or are not displaced significantly. The basic actions done through the optimization are described in the following.

1. In a step 933, remove cell functionalities that are not used in any size. Cells that are in the library but are not used in any size can be removed from the library in order to minimize the number of cells that have to be generated.

2. In a step 935, for the cells that are used, remove sizes that are not used. Unused sizes can also be removed to simplify the library.

3. In a step 937, for used cells and sizes, add additional sizes to allow adjusting existing ones for timing closure. As the circuit is placed and routed and the timing is closed or near to be closed, the cells are near to the final sizes that will be used. For every used cell/size, a set of neighbor sizes is introduced in the library, to allow final timing fixing.

4. In a step 939, adjust library template to optimize new mix of cells in the optimized design. As a new mix of cells is produced, the library template can be optimized to better accommodate the set of cells present in the optimized library. The library template defines cell height, width of power supplies, regions for P and N diffusion, and so forth.

Figure 10:
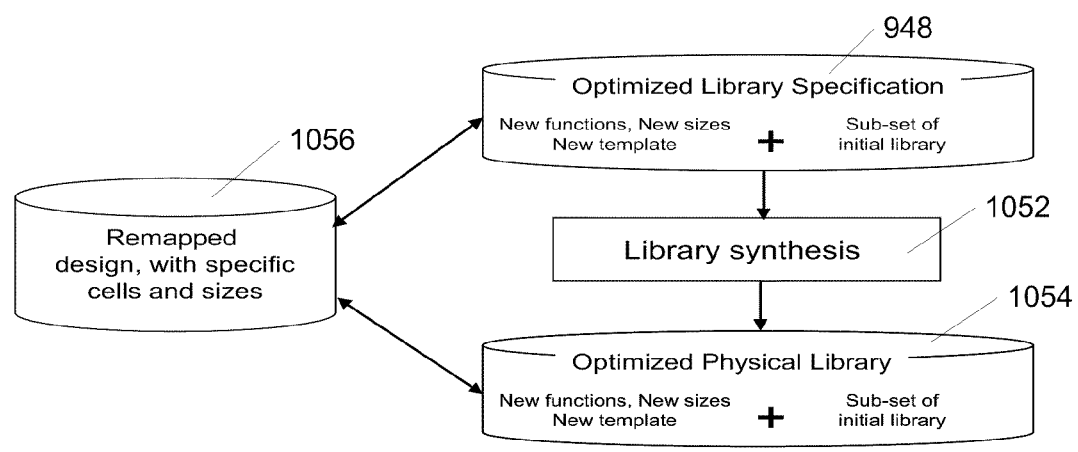
FIG. 10 shows generation of the final library.

After an optimized library specification 948 is generated, the technique proceeds to a synthesis 1052 of the correspondent optimized physical library, as depicted in FIG. 10. This corresponds to the transformation (through physical synthesis) of virtual and virtual2 cells into physical implementations. The physical implementations of the cells will then constitute an optimized physical library 1054 that will be used to carry out the final design closure for tape out. Notice that the design may have to be updated (as indicated by remapped design 1056) to reflect the new library, after physical synthesis. This step is also to be done automatically in the scope of this invention.

The current invention provides advantages over prior art. The invention uses more realistic data in terms of area and performance (power, delay, yield, and others). It also allows controlling the type and number of newly created functionalities.

The invention has the advantage of adding new cells that can be useful to optimize the design. Additionally, the invention has the step of adding neighborly sized cells to allow final timing closure and optimization.

The invention has the advantage of exploiting new functionalities, different transistor topologies, different sizes, and variations of the cell template. The different sizes in other approaches are generated by interpolation of existing cell sizes, which can add a lot of imprecision when the different sizes have different topologies. The invention described here has not this problem and support even the use of more than one topology with the same drive strength.

The invention is more powerful as cells are first added to the library, and then the mapping tool decides which cells are interesting to be used. The invention presented here exploits a large set of cells by having the possibility to use precomputed data about the virtual cells (initial characterization and area preview), which make the invention presented here faster.

Another point is that there is no need to group cells by similarity (uniquify the cells) when inserting them in the library: the cells are already available in the virtual library (set of additionally available functionalities) with a choice of sizes that enable the mapping tool to choose the same cell size when conditions are similar; making this a nonissue in the context of this invention. The invention presented here allows controlling the type of new functionalities that will be created a priory, by adding different flavors of new cells to the library; and then control cell quantity in subsequent steps. This is fundamentally different from the approaches where the cell is generated to satisfy the conditions and then there is a verification step to see if a similar already existing cell can be used instead.

Other approaches have no features to control the number of newly generated cells. Another advantage of the invention is the step of adding neighborly sized cells to allow final timing closure and optimization, if the conditions of use of the cells (e.g., placement) change slightly.

The invention takes a design into account and automatically produces the specification of the desired cells to optimize the design. Other approaches provide no help to the designer to accomplish this task, as the designer was required to produce the cell specifications by himself.

Figure 11:
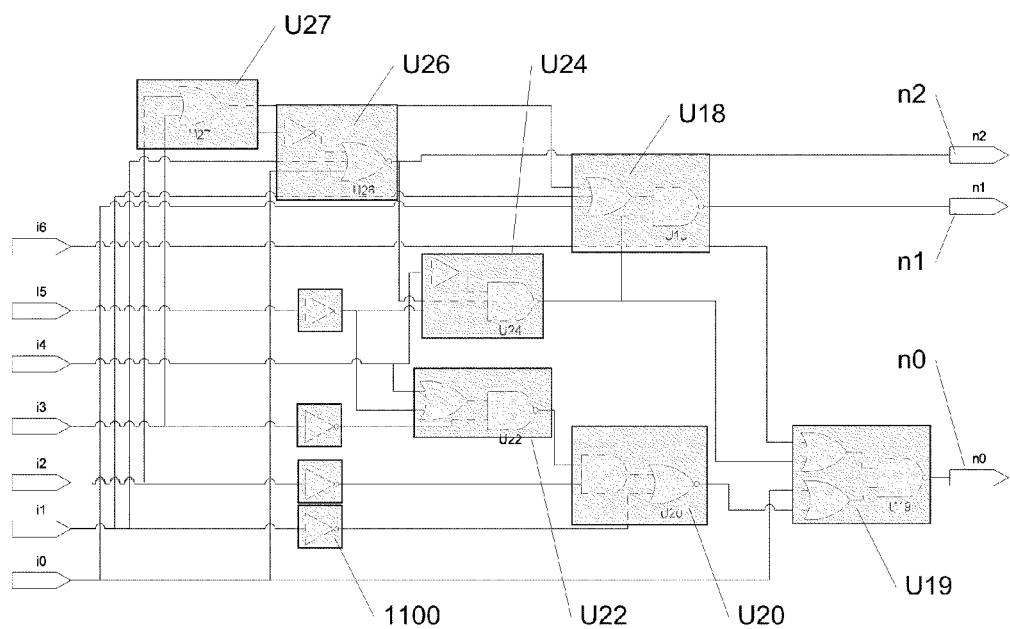
FIG. 11 shows a circuit composed of eleven cell instances.

As an example of application of the invention presented here, consider the circuit shown in FIG. 11. It is a circuit produced by using a regular standard cell library. So this circuit would use the cells listed in the picture, including: inverters 1100, NOR2 (U27), NOR3 with one inverted input (U26), NAND3 with one inverted input (U24), OAI21 (U22), OAI31 (U18), AOI21 (U20), and OAI22 (U19). OAI is an OR-AND-INVERT gate. AOI is an AND-OR-INVERT gate. Those are cells that can be found in most regular libraries. It is important to note that the circuit has eleven cells instances.

For this particular example, an enriched library can be used, as for instance the library induced by using combinational cells with a limited number of serially connected PMOS and NMOS transistors in logic gates composed of series and parallel associations of transistors. In this approach, a virtual or physical library can be available, or the cell generator tool can provide cost estimations for the cells to be added.

Figure 12:
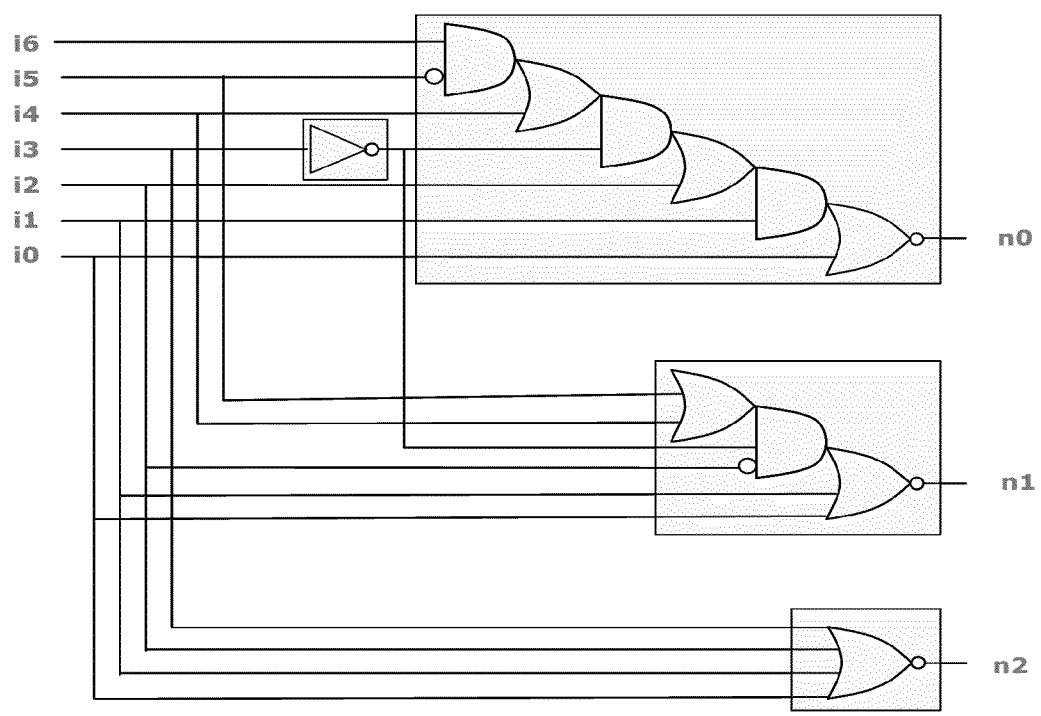
FIG. 12 shows an equivalent circuit composed of four cell instances.

By using series and parallel combinations of transistors up to four transistors in series, and allowing the negation of inputs/outputs of the cells, the circuit in FIG. 12 can be obtained. Notice that the number of instances is reduced to four. Even if the cells in FIG. 12 are possibly larger than the ones in FIG. 11, it is important to note that the smaller number of cell instances compensates the use of larger cells. Indeed, the circuit in FIG. 12 requires fewer transistors to implement.

Also, the circuit in FIG. 12 can be more efficiently sized, as fewer cell outputs need to be buffered. Note that the set of additionally admissible functionalities in this step could be defined explicitly or implicitly, as described before and repeated below.

The set of additionally admissible logic functionalities defines the list of functionalities that can be viewed as single cells. In this flow, the new admissible functionalities are used to generate candidate cells to be added to the library, thus enriching the set of available cells. The set of additionally admissible functionalities can be described implicitly or explicitly or even by a combination of the two (implicit and explicit definition).

Some different examples of implicit definition of a library are given below. The examples in this application (below and elsewhere) are provided to illustrate some aspects the invention and these aspects can be applied and modified as needed or desired for a particular application. The breadth of the invention should not be limited or restricted in any way to the specific examples given.

Example 1 (for implicit library definition): by number of inputs. When defining a library by number of inputs, functionalities can be accepted or discarded according their number of inputs. The specific values for the numbers of inputs to be accepted or rejected are parameters that implicitly define the functionalities in the library.

Example 2 (for implicit library definition): by number of series and parallel transistors in a series parallel implementation. When defining a library by number of series and parallel transistors, functionalities can be accepted or discarded according their number of series and parallel transistors. The specific values for the numbers of series and parallel transistors to be accepted or rejected are parameters that implicitly define the functionalities in the library.

Example 3 (for implicit library definition): by BDD height. When defining a library by BDD height, functionalities can be accepted or discarded according the height of a BDD representing the functionality. The specific values for the BDD heights to be accepted or rejected are parameters that implicitly define the functionalities in the library.

Example 4 (for implicit library definition): by the minimum (worst case) length transistor chains achievable in a general switch implementation. This is a "lower bound" in the number of number of series transistors. When defining a library by the minimum achievable (worst case) length of transistor chains, functionalities can be accepted or discarded according their minimum achievable (worst case) length of transistor chains. The specific values for the minimum achievable (worst case) length of transistor chains to be accepted or rejected are parameters that implicitly define the functionalities in the library.

Example 5 (for implicit library definition): any combination of the four methods above, including combining functionalities from these examples with functionalities present in the original library (including generating associations of cells in the original library). Note that for each cell functionality defined implicitly or explicitly, cells variations can be created, including: different transistor topologies, different sizing of the transistors and different drive strengths. Notice that these methods are presented for exemplification only and the invention is not restricted to use the methods exemplified here.

The explicit definition consists in explicitly listing the set of additionally admissible logic functionalities. This consists in explicitly providing a list of additionally available functionalities in any format suitable for the execution of the method.

Figure 13:
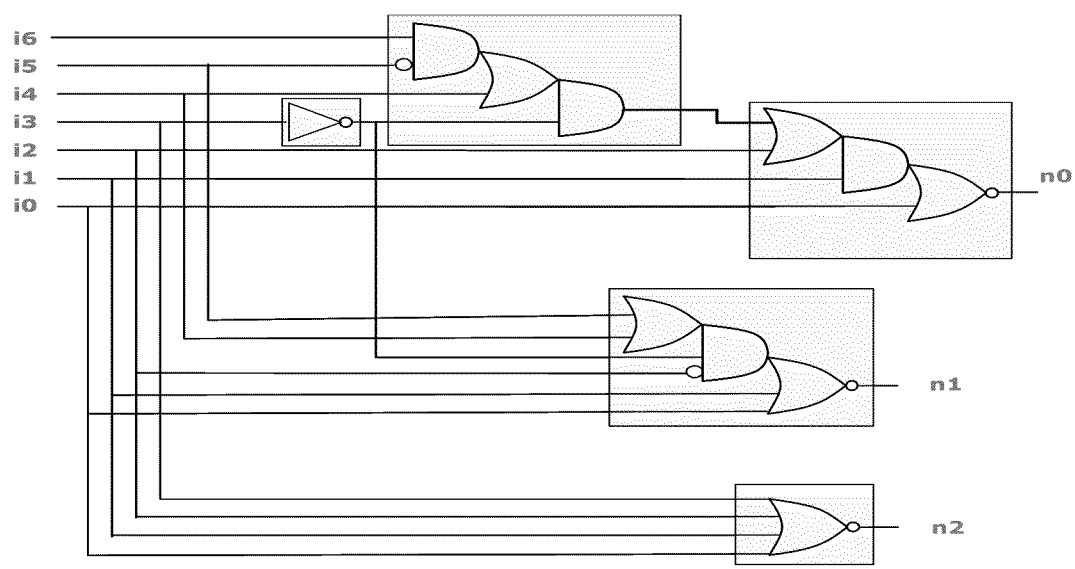
FIG. 13 shows an equivalent circuit composed of five cell instances.

The step of filtering the library to reduce the cells is illustrated in FIG. 13, which presents a circuit resulting from this step. Consider that the example presented here is part of a much larger circuit, and that the cell generating output signal n0 in FIG. 12 has very few instances in the scope of the larger circuit. Then this particular cell can be forbidden in the library and remapped to cells with a higher number of instances.

This would result in the circuit of FIG. 13, where the cell generating n0 has been substituted by two instances of cells having a large number of instances in other subcircuits of the larger circuit defining the scope. This process takes into account information of the number of instances that each cell has in a first mapping, and has the goal of removing cells with few instances that do not imply a significant cost increase when removed from the library.

Next steps for the library enrichment process consider that each used cell has to be available in a sufficient number of sizes. This way, size variants (X1, X1.5, X2, X4, and so forth) are added to the library for each selected cell to compose the library. This is used to allow place and route tools to perform the final timing closure and optimization efficiently.

Once the sizes are added, a new template may be defined for the library. As the cells and number of instances are known, it is possible to use the library generation tool API to inquire about the characteristics of the cells for different templates, in order to choose a template that reduces the overall cost of implementation.

Figure 14A:
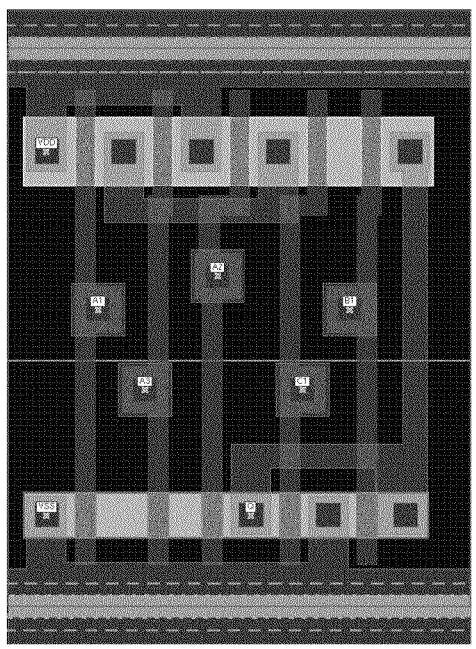
FIGS. 14A and 14B show integrated circuit layouts of nine- and seven-track versions of the same cell.
Figure 14B:
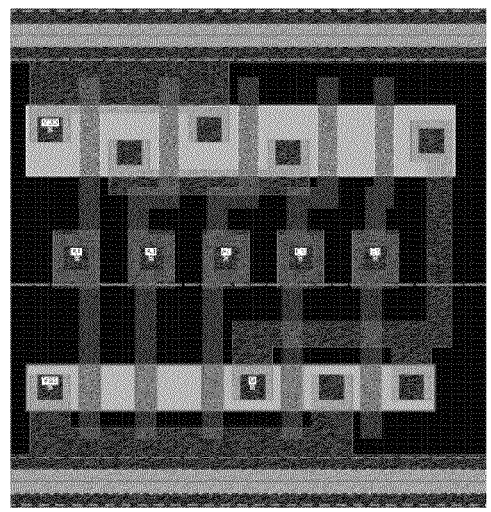

FIGS. 14A and 14B illustrate the application of two different templates to the same logic functionality. Notice that the cell will accommodate differently for a nine tracks (FIG. 14A) and a seven tracks template (FIG. 14B). In this particular case, it is possible to notice that the seven tracks template will result in a smaller area. This situation can vary from cell to cell and a weighted decision has to be taken based on the number of cell instances or other metrics. This step can be applied again after the final timing closure, as some cell sizes can be changed during this process, altering the histogram of use.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A method comprising:
providing a first integrated circuit design netlist;
mapping groupings of cell instances within the first integrated circuit netlist as corresponding to a preferential set of cells in a first library of cells, stored on a nontransitory computer-readable medium;
removing from the mapping instances of nonpreferable cells associated with a first nonpreferable cell, wherein the mapping will not include any cell mappings associated with the first nonpreferable cell
wherein the removing from the mapping instances of nonpreferable cells associated with a first nonpreferable cell comprises:
removing sizes of cell instances that are not used in the initial integrated circuit design netlist; and
removing a cell instance when it is used fewer than X times, wherein X is a user-defined threshold parameter; and
generating a second library comprising only the preferential set of cells identified in the mapping, wherein the second library does not include any cell mappings associated with the first nonpreferable cell and is stored on a nontransitory computer-readable medium, and
the generating a second library includes performing a physical synthesis, not a logic synthesis, to obtain cells for the second library.

2. The method of claim 1 comprising:
mapping the first integrated circuit design netlist to a second integrated circuit design netlist, which uses the second library but not the first library; and
storing the second integrated circuit design netlist on a nontransitory computer-readable medium.

3. The method of claim 1 comprising:
before generating the second library, adding in the second library a second cell, not in the first library, wherein the second integrated circuit design netlist comprises at least one reference to the second cell.

4. The method of claim 1 comprising:
after generating the second library, identifying and removing at least a second cell of the second library;
generating a third library comprising the cells of the second library, but not the second cell;
mapping the first integrated circuit design netlist to a second integrated circuit design netlist, which has references to the third library but not first or second libraries; and
storing the second integrated circuit design netlist on a nontransitory computer-readable medium.

5. A method comprising:
providing an initial integrated circuit design netlist;
mapping a first plurality of cell instances in the initial integrated circuit netlist that correspond to a second plurality of cell instances in a first library of cells, stored on a nontransitory computer-readable medium, to obtain a first mapping of cell instances;
removing from the first mapping a third plurality of cell instances that correspond to a second cell to obtain a second mapping of cell instances, wherein the second mapping will not comprise the third plurality of cell instances
wherein the removing from the first mapping a third plurality of cell instances that correspond to a second cell to obtain a second mapping of cell instances comprises:
removing sizes of cell instances that are not used in the initial integrated circuit design netlist; and
removing a cell instance when it is used fewer than X times, wherein X is a user-defined threshold parameter; and
using the second mapping, generating a second library comprising the cell instances in the second mapping, wherein the second library is stored on a nontransitory computer-readable medium, and
the generating a second library includes performing a physical synthesis, not a logic synthesis, to obtain cells for the second library.

6. The method of claim 5 wherein the second plurality of cell instances comprise a preferential group of cells.

7. The method of claim 6 wherein the second cell comprises a nonpreferable cell.

8. The method of claim 5 wherein the first library of cells comprises the second cell.

9. The method of claim 5 wherein the second library comprises fewer cell instances then the first library.

10. The method of claim 5 wherein the initial circuit netlist is provided by at least one of an expression of a plurality of cells or Boolean equations.

11. The method of claim 5 wherein the second library is different from the first library.

12. A method comprising:

providing an initial integrated circuit design netlist;

providing a first library of cells;

using at least one processor, mapping a first plurality of cell instances in the initial integrated circuit netlist that correspond to a second plurality of cell instances in the first library of cells to obtain a first mapping of cell instances;

removing from the first mapping a third plurality of cell instances that correspond to a second cell to obtain a second mapping of cell instances, wherein the second mapping does not not comprise the third plurality of cell instances wherein the removing from the first mapping a third plurality of cell instances that correspond to a second cell to obtain a second mapping of cell instances comprises:

removing sizes of cell instances that are not used in the initial integrated circuit design netlist; and removing a cell instance when it is used fewer than X times, wherein X is a user-defined threshold parameter; and using the second mapping, generating a second library comprising the cell instances in the second mapping, and the generating a second library includes performing a physical synthesis, not a logic synthesis, to obtain cells for the second library.

13. The method of claim 12 wherein the second library comprises fewer cell instances then the first library.

14. The method of claim 12 wherein the second plurality of cell instances comprise a preferential group of cells.

15. The method of claim 14 wherein the second cell comprises a nonpreferable cell.

16. The method of claim 12 wherein the removing from the first mapping a third plurality of cell instances that correspond to a second cell to obtain a second mapping of cell instances comprises:

removing less frequently used cell instances.

17. The method of claim 12 wherein the second library is more compact than the first library.

* * * * *